(12) United States Patent
Li et al.

(10) Patent No.: US 11,740,265 B1
(45) Date of Patent: Aug. 29, 2023

(54) SIGNAL CONDITIONING CIRCUIT

(71) Applicant: Accuenergy (Canada) Inc., Toronto (CA)

(72) Inventors: Ketao Li, Toronto (CA); Yufan Wang, Toronto (CA); Liang Wang, Toronto (CA)

(*) Notice: Subject to any disclaimer, the term of this patent is extended or adjusted under 35 U.S.C. 154(b) by 0 days.

(21) Appl. No.: 17/836,432

(22) Filed: Jun. 9, 2022

(51) Int. Cl.
| G01R 19/25 | (2006.01) |
| G01R 15/18 | (2006.01) |
| G01R 19/32 | (2006.01) |
| H01H 47/02 | (2006.01) |

(52) U.S. Cl.
CPC ........ *G01R 19/2506* (2013.01); *G01R 15/181* (2013.01); *G01R 19/32* (2013.01); *H01H 47/02* (2013.01); *H01H 2047/025* (2013.01)

(58) Field of Classification Search
CPC .. G01R 19/2506; G01R 15/181; G01R 19/32; H01H 47/02; H01H 2047/025
USPC ........................................................ 324/127
See application file for complete search history.

(56) References Cited

U.S. PATENT DOCUMENTS

| 9,588,147 | B2 | 3/2017 | Vos | |
| 2008/0136399 | A1* | 6/2008 | Alfano | G01R 19/0092 324/98 |
| 2011/0216451 | A1* | 9/2011 | Haines | H02H 3/338 361/93.6 |
| 2016/0134224 | A1* | 5/2016 | Bock | G01K 7/00 318/473 |
| 2016/0223592 | A1* | 8/2016 | Vos | G01R 15/181 |
| 2020/0209284 | A1* | 7/2020 | Torres | G01R 19/12 |

FOREIGN PATENT DOCUMENTS

| CN | 107887890 A | * | 4/2018 | .......... G01R 31/327 |
| CN | 105934858 B | * | 3/2019 | ............ H01H 9/542 |
| CN | 115411836 A | * | 11/2022 | |
| GB | 2259150 A | * | 3/1993 | .......... G01R 15/181 |
| JP | 2020071958 A | * | 5/2020 | |

OTHER PUBLICATIONS

Xu et al., Design of PCB Rogowski Coil Current Sensor With Low Droop Distortion, 38 IEEE Trans. Power Elec. 5513 (Apr. 2023) (Year: 2023).*
Li et al., An Improved Fast Distance Relay to Mitigate the Impacts of Rogowski Coil Transducer Transient, 37 IEEE Trans. Power Delivery 1549 (Jun. 2022) (Year: 2022).*

* cited by examiner

*Primary Examiner* — Tung X Nguyen
*Assistant Examiner* — Robert P Alejnikov, Jr.

(57) ABSTRACT

A signal conditioning circuit for monitoring at least one parameter of an electrical signal in an electrical conductor. The signal conditioning circuit can include an integrator circuit having an input for receiving a signal from a current sensor coupled to the electrical conductor. A first analog switch has an input coupled to the output of the integrator circuit, wherein the first analog switch is controlled by the output of a time delay circuit. A power stage circuit has an input coupled to the output of the first analog switch. The signal conditioning circuit can be used for line fault detection.

20 Claims, 8 Drawing Sheets

SIGNAL CONDITIONING CIRCUIT

FIELD OF THE INVENTION

The present disclosure generally relates to a signal conditioning circuit for monitoring at least one parameter of an electrical signal in an electrical conductor and, more specifically, to a circuit in protective relay applications.

BACKGROUND

In electrical engineering, a protective relay is a relay device designed to trip a circuit breaker when a fault is detected. In prior art, protective relay applications rely on heavy; rigid-body current sensors, resulting in inconvenient installation, especially around large or irregularly shaped conductors.

Flexible current sensors, such as Rogowski coils, could be an option to replace the traditional heavy, rigid-body current sensors in protective relay applications. However, the output of the Rogowski coil must be passed through a Rogowski integrator circuit to obtain the current waveform. It is a characteristic of the Rogowski integrator circuit to present a transient state at power up. This transient state is caused by the high gain of the circuit at low frequencies and by, the stabilization time of the supply and reference voltages. FIG. 1 shows an example of the oscillation waveform of outputs from the Rogowski integrator circuit. The oscillation during the transient state may increase electrical stress on the components.

Therefore, further improvements to protective relay applications using Rogowski coils would be desirable.

SUMMARY OF THE INVENTION

The embodiments of the present disclosure generally relate to a signal conditioning circuit for monitoring at least one parameter of an electrical signal in an electrical conductor.

In some embodiments, the present disclosure provides a signal conditioning circuit for monitoring at least one parameter of an electrical signal in an electrical conductor. The signal conditioning circuit includes an integrator circuit having an input for receiving a signal from a current sensor coupled to the electrical conductor; a first analog switch having an input coupled to the output of the integrator circuit, wherein the first analog switch is controlled by the output of a time delay circuit; a power stage circuit having an input coupled to the output of the first analog switch.

In some embodiments of the signal conditioning circuit, the time delay circuit triggers the first analog switch to isolate the power stage circuit from the integrator circuit when the integrator circuit works in a transient state at power up. In some embodiments, the time delay circuit triggers the first analog switch to conduct electricity from the integrator circuit to the power stage circuit when the integrator circuit works in a steady state after power up. In some embodiments, the power stage circuit has an output coupled to a protective relay device. In some embodiments, the signal conditioning circuit further comprises a scaling circuit having an output coupled to the integrator circuit to configure a current range of the electrical conductor. In some embodiments, the signal conditioning circuit further comprises a second analog switch having an input coupled to the output of the first analog switch, wherein the second analog switch is controlled by a temperature detector circuit to detect a working temperature of the power stage circuit. In some embodiments, the temperature detector circuit triggers the second analog switch to isolate the power stage circuit from the integrator circuit when the power stage circuit works above a first specified temperature. In some embodiments, the temperature detector circuit triggers the second analog switch to conduct electricity from the integrator circuit to the power stage circuit when the power stage circuit works below a second specified temperature. In some embodiments, the signal conditioning circuit further comprises a signal filtering circuit having an output coupled to the integrator circuit. In some embodiments; the current sensor comprises a Rogowski coil.

In some other embodiments, the present disclosure provides a protective relay system. The protective relay system includes a current sensor located proximate to a current conductor for detecting current in the conductor; a signal conditioning circuit coupled to the current sensor including an integrator circuit; a time-controlled switch having an input coupled to the output of the integrator circuit; and a power stage circuit having an input coupled to the output of the time-controlled switch; a protective relay device coupled to the signal conditioning circuit; and a circuit breaker coupled to the protective relay device.

In some embodiments of the protective relay system, the current sensor comprises a Rogowski coil. In some embodiments, the time-controlled switch comprises an analog switch controlled by a time delay circuit. In some embodiments, the protective relay system further comprises a power supply powering the signal conditioning circuit. In some embodiments, the time-controlled switch isolates the power stage circuit from the integrator circuit when the integrator circuit works in a transient state at power up. In some embodiments, the time-controlled conducts electricity from the integrator circuit to the power stage circuit when the integrator circuit works in a steady state after power up. In some embodiments, the power stage circuit has an output coupled to a protective relay device. In some embodiments, the protective relay system further comprises a temperature-controlled switch connected with the time-controlled switch in series.

These and other features and aspects of the present disclosure will become fully apparent from the following detailed description of exemplary embodiments, the appended claims, and the accompanying drawings.

DETAILED DESCRIPTION

Embodiments of the present disclosure will be described herein with reference to the accompanying drawings. In the following descriptions, well-known functions or constructions are not described in detail to avoid obscuring the present disclosure. The word "exemplary" is used herein to mean "serving as an example." Any configuration or design described herein as "exemplary" is not to be constructed as preferred, or advantageous, over other configurations or designs. Herein the phrase "coupled" is defined as "directly connected to or indirectly connected with" one or more intermediate components. Such intermediate components may include both hardware and software-based components.

It is further noted that, unless otherwise indicated, all functions described herein may be implemented in either software, hardware, or some combination thereof.

It should be recognized that the present disclosure can be performed in numerous ways, including as a process, an apparatus, a system, a method, or a computer-readable medium such as a computer storage medium.

As used herein, Intelligent Electronic Devices ("IEDs") can be any device that senses electrical parameters and computes data including, but not limited to, Programmable Logic Controllers ("PLCs"), Remote Terminal Units ("RTUs"), electrical power meters, protective relays, fault recorders, phase measurement units, and other devices which are coupled with power distribution networks to control and manage the distribution or consumption of electrical power.

Figure 1:
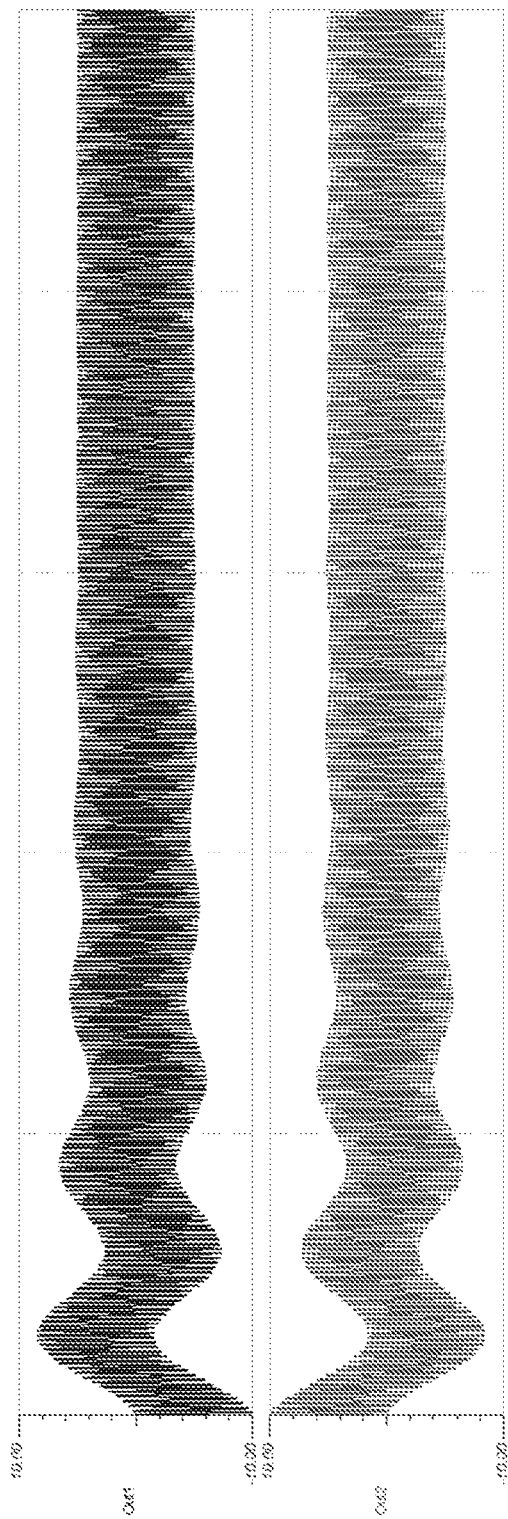
FIG. 1 is a diagram of an example oscillation waveform of outputs of the Rogowski integrator circuit.
Figure 2:
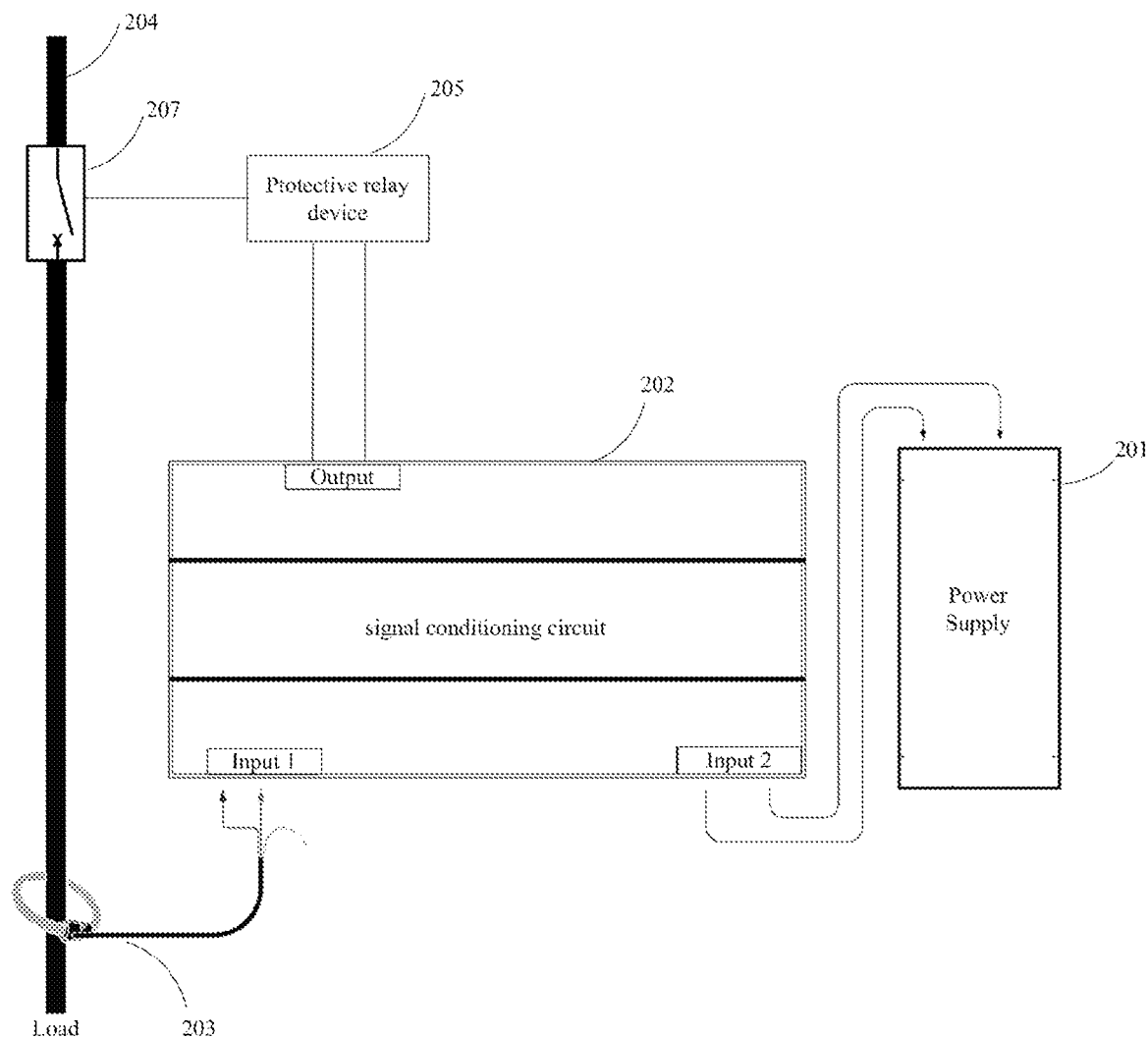
FIG. 2 is a schematic diagram of a protective relay system for safeguarding sensitive electrical equipment in electric power systems.

FIG. 2 is a schematic diagram of an exemplary protective relay system 200 for safeguarding sensitive electrical equipment in electric power systems. The protective relay system 200 in FIG. 2 can include a power distribution line 204 coupled with a Rogowski coil 203, a signal conditioning circuit 202, a power supply 201, a circuit breaker 207, and a protective relay device 205.

The power supply 201 may provide power to the signal conditioning circuit 202. In one embodiment, the power supply 201 can include a transformer with its primary windings coupled to the power distribution line 204 to provide DC power generated by an AC-DC converter coupled to its secondary windings. In another embodiments, the power supply 201 may provide power to the signal conditioning circuit 202 from an independent power source (e.g., batteries).

The protective relay device 205 can be an intelligent device found in electric power systems that may be responsible for safeguarding sensitive electrical equipment powered by the power distribution line 204, such as motors, transformers, transmission lines, or generators from abnormal power conditions. It can receive input from the signal conditioning circuit 202 and compares the incoming values to a set value (trip value) to detect when a fault has occurred. In response, the circuit breaker 207 coupled with the protective relay device 205 can be tripped to isolate the fault from the rest of the system and prevent damage.

The Rogowski coil 203 can be a flexible current sensor. It can be an electrical device for measuring alternating current (AC) or high-speed current pulses. It can sometimes consist of a helical coil of wire with the lead from one end returning through the centre of the coil to the other end so that both terminals can be at the same end of the coil. Since the voltage that can be induced in the coil can be proportional to the rate of change (derivative) of current in the straight conductor, the output of the Rogowski coil 203 may usually be connected to an electrical (or electronic) integrator circuit (e.g., integrator circuit 303) to provide an output signal that can be proportional to the current.

The signal conditioning circuit 202 can receive electrical signal from the Rogowski coil 203 and output a specified rated electrical signal to the protective delay device 205. In one embodiment, the signal conditioning circuit 202 can be rated for class 5P20 (IEC 61869-2). This means that if the primary current can be 20 times the rated primary current of the power distribution line 204, it may be able to sense and measure the current with an accuracy of 5%.

In another embodiment, the signal conditioning circuit 202 can output the specified rated electrical signal to other IEDs such as power meter.

Figure 3:
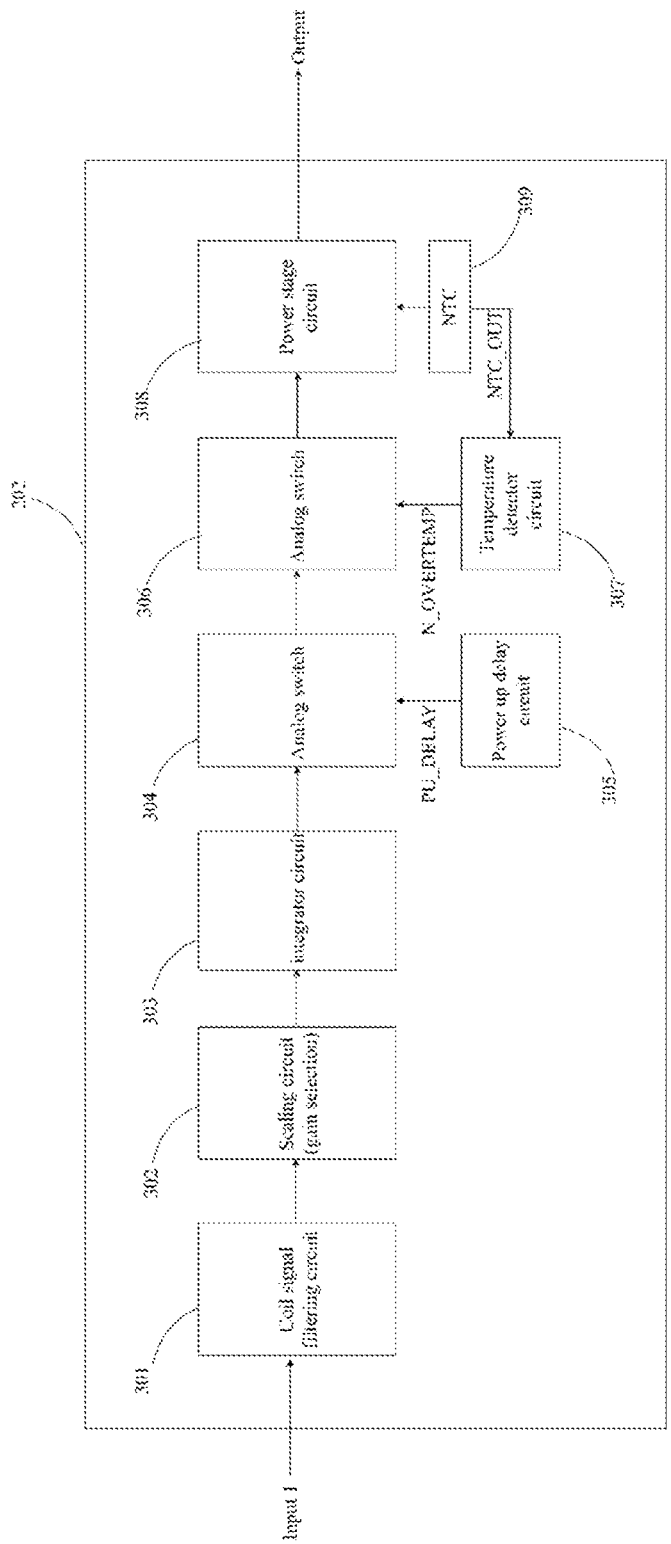
FIG. 3 is a block diagram of a signal conditioning circuit for monitoring the current in the power distribution line in accordance with one embodiment of the disclosure.

The example of FIG. 3 is a block diagram of the signal conditioning circuit 202 for monitoring the current in the power distribution line 204. The signal conditioning circuit 202 can include a coil signal filtering circuit 301, a scaling circuit (gain selection) 302, an integrator circuit 303, an analog switch 304, an analog switch 306, a time delay circuit 305, a temperature detector circuit 307, a power stage circuit 308 and a NTC circuit 309.

The coil signal filtering circuit 301 can receive electrical signal from the Rogowski coil 203 and passes the specified signal. The scaling circuit (gain selection) 302 may implement the functionality of field-configurable current ratios.

In one embodiment, the face of the signal conditioning circuit 202 has a set of dip switches that can be used to configure the current range. The dip switches may couple to the scaling circuit (gain selection) 302 to configure the current range. When the dip switch is in the up position, the dip switch may be ON. When the dip switch is in the down position, the dip switch may be OFF. Configure dip switches to output the desired range. In the exemplary Table 1, to measure current rated for 500 A, the dip switch 1 through 5 must be configured to 'OFF', 'OFF', 'ON', 'OFF', 'OFF'. The table 1 below outlines the position of the dip switches for the desired current ranges. In Table 1, there can be 5 dip switches. It should be noted that the total number of dip switches may be different from examples in table 1 due to the different applications.

TABLE 1

Current ratio table

| | 1 | 2 | 2 | 4 | 5 |
|---|---|---|---|---|---|
| 50:1A | ON | OFF | OFF | OFF | OFF |
| 200:1A | OFF | ON | OFF | OFF | OFF |
| 500:1A | OFF | OFF | ON | OFF | OFF |
| 2000:1A | OFF | OFF | OFF | ON | OFF |
| 5000:1A | OFF | OFF | OFF | OFF | ON |

In one embodiment, for each current range, the signal conditioning circuit 202 may be able to measure the current from 0.5% up to 2000% of the rated current. For example, when the signal conditioning circuit 202 may be configured to measure a current rated for 500 A, it can measure the current from 2.5 A to 10,000 A. Table 2 provides some of the ranges of current that can be measured for each range.

TABLE 2

Current Range Configurations

| Primary Input (Arms) | Sensing Range (A) | Output | Relay Class Output | CT Ratio |
|---|---|---|---|---|
| 50 | 0.25 to 1,000 | 1A @ 50A | 20A @ 1 kA | 50:1A |
| 200 | 1 to 4,000 | 1A @ 200A | 20A @ 4 kA | 200:1A |
| 500 | 2.5 to 10,000 | 1A @ 500A | 20A @ 10 kA | 500:1A |
| 2,000 | 10 to 40,000 | 1A @ 2,000A | 20A @ 40 kA | 2,000:1A |
| 5,000 | 25 to 100,000 | 1A @ 5,000A | 20A @ 100 kA | 5,000:1A |

The field-configuration current transformer ratios are a sought-after feature and give the signal conditioning circuit 202 more versatility by permitting operators to utilize the more of existing assets while providing additional control and options over the configuration of the electrical power system, introducing further cost savings.

Since the voltage that may be induced in the Rogowski coil 203 may be proportional to the rate of change (derivative) of current in the power distribution line 204, the output of the Rogowski coil 203 may be usually connected to an integrator circuit 303 to provide an output signal that can be proportional to the current. The integrator circuit 303 may be implemented by the prior art.

The power stage circuit 308 can perform the basic power conversion from the input voltage to the output voltage and can provide a signal to the protective relay device 205.

In prior art, the output of the integrator circuit 303 can be coupled to the power stage circuit 308 directly. It can be a characteristic of the Rogowski integrator circuit to present a transient state at power up. This transient state may be caused by the high gain of the circuit at low frequencies and by the stabilization time of the supply and reference voltages. The oscillation during the transient state may increase electrical stress on the components.

Analog switch 304 and the analog switch 306 can conduct analog or digital signals in either direction when on and isolate the switched terminals when off. In one embodiment, the analog switch 304 and the analog switch 306 may be implemented in an integrated circuit (e.g., a Vishay Siliconix's DG401). In another embodiment, the analog switch 304 and the analog switch 306 may be implemented using discrete switch components. It should be noted that only one of the analog switch 304 and the analog switch 306 in FIG. 3 may be used in some embodiments according to the different applications.

A signal PU_DELAY may be used to switch on/off the analog switch 304. In one embodiment, the signal PU_DELAY may switch off the analog switch 304 when the Rogowski coil integrator circuit 303 can be in a transient state. Then the Rogowski coil integrator circuit 303 isolated from the power stage circuit 308. The signal PU_DELAY may switch on the analog switch 304 when the Rogowski coil integrator circuit 303 can reach a steady state from the transient state. Then the output of the Rogowski coil integrator circuit 303 can pass to the power stage circuit 308 through the analog switch 304.

A signal N_OVERTEMP can be used to switch on/off the analog switch 306. In one embodiment, the signal N_OVERTEMP may switch off the analog switch 306 when the power stage circuit 308 can reach in an overtemperature state. Then the Rogowski coil integrator circuit 303 can be isolated from the power stage circuit 308. The signal N_OVERTEMP may switch on the analog switch 306 when the power stage circuit 308 can reach in a normal temperature state from the overtemperature state. Then the output of the Rogowski coil integrator circuit 303 can pass to the power stage circuit 308 through the analog switch 304 and the analog switch 306.

Figure 4:
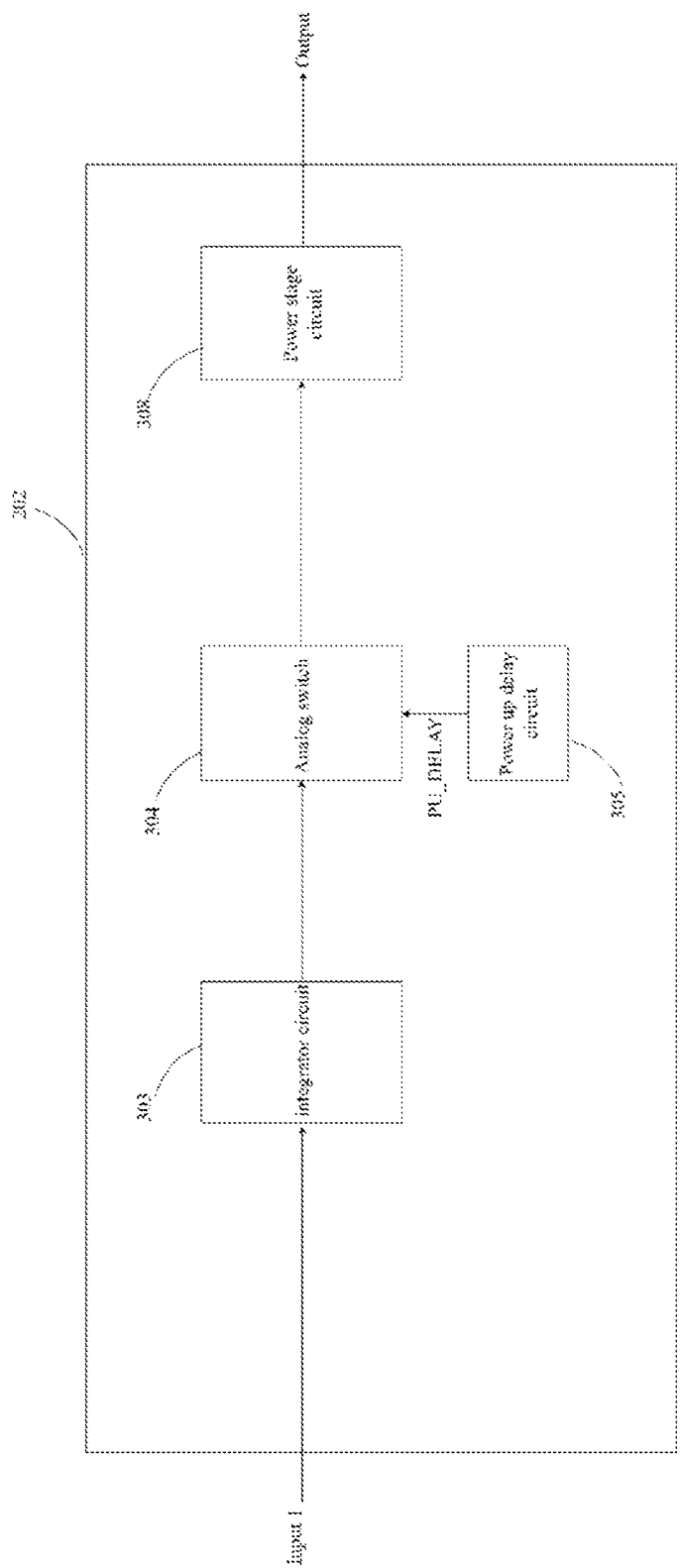
FIG. 4 is a block diagram of the signal conditioning circuit for monitoring the current in the power distribution line in accordance with one embodiment of the disclosure.
Figure 5:
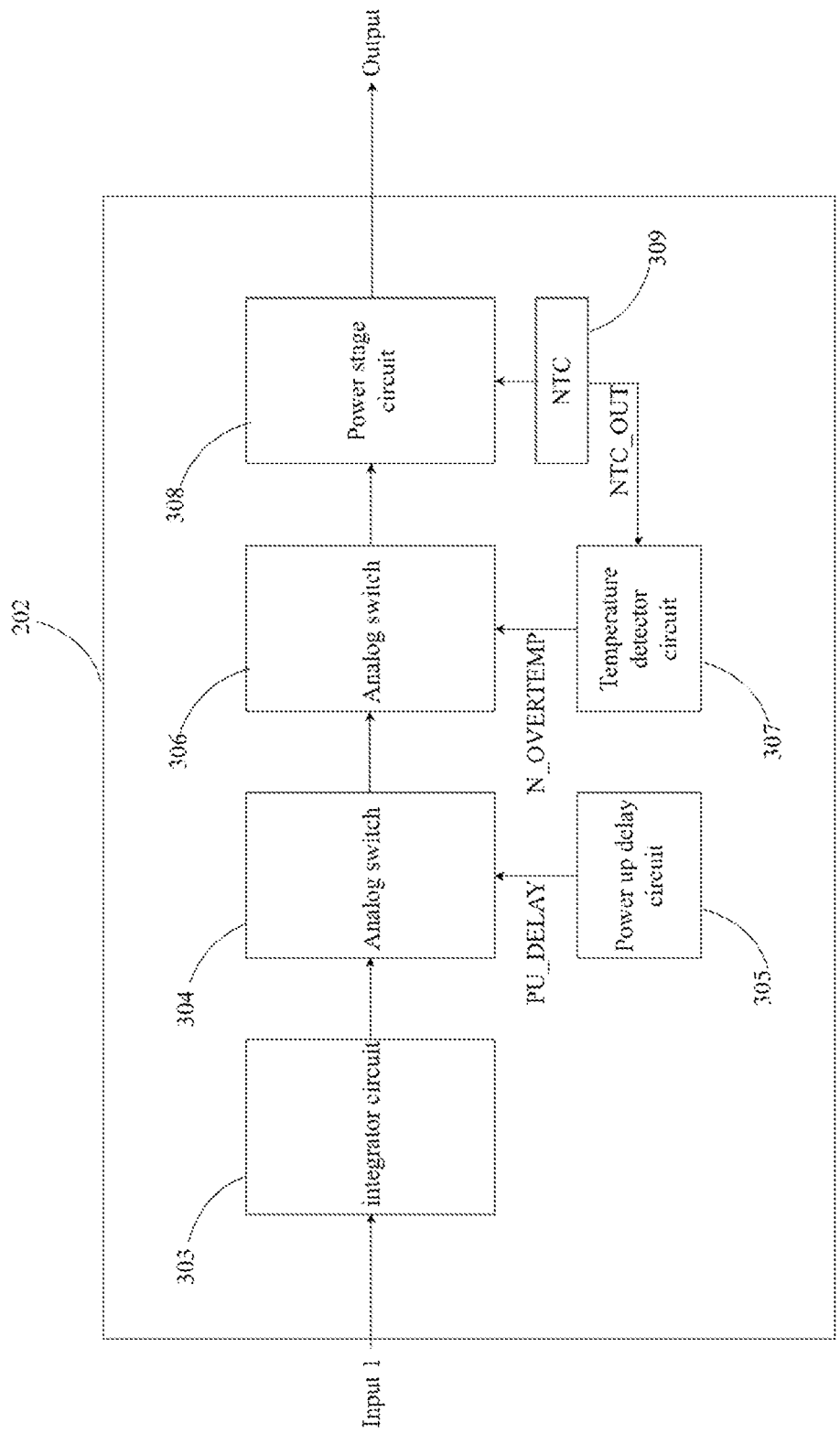
FIG. 5 is a block diagram of the signal conditioning circuit for monitoring the current in the power distribution line in accordance with one embodiment of the disclosure.

It should be recognized that the coil signal filtering circuit 301, scaling circuit (gain selection) 302, analog switch 306, temperature detector circuit 307, NTC circuit 309 are optional components. In some embodiments, the signal conditioning circuit 202 may include at least one of them or even none of them. FIG. 4 and FIG. 5 describe two exemplary embodiments.

The example of FIG. 4 is a block diagram of the signal conditioning circuit 202 for monitoring the current in the power distribution line 204 in accordance with one embodiment of the disclosure. The example of FIG. 5 is a block diagram of the signal conditioning circuit 202 for monitoring the current in the power distribution line 204 in accordance with one embodiment of the disclosure.

Figure 6:
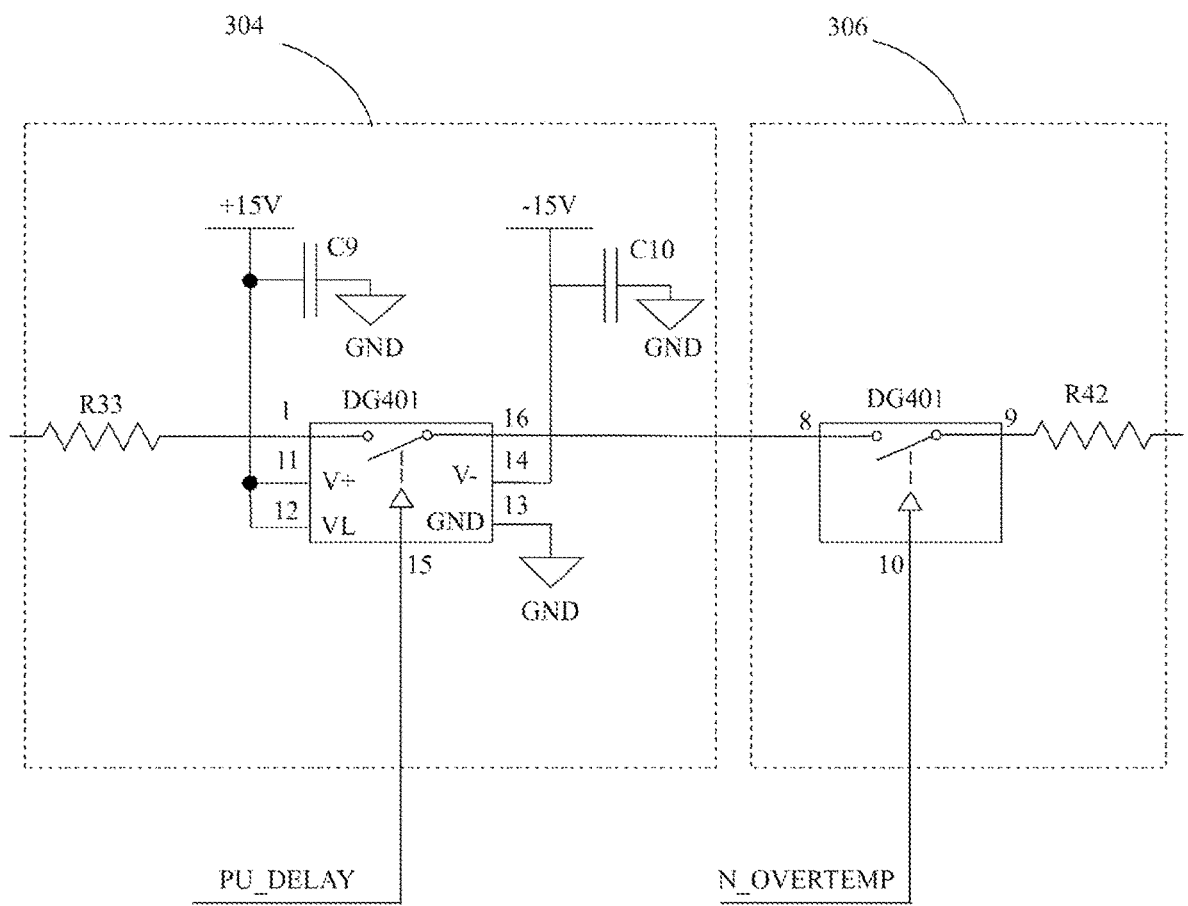
FIG. 6 is a schematic diagram of an example circuit of analog switches.

The example of FIG. 6 is a schematic diagram of analog switch circuit 304 and analog switch circuit 306. In FIG. 6, the analog switch 304 and analog switch 306 can be implemented in a Vishay Siliconix's DG401.

When the voltage of the signal PU_DELAY is higher than the analog switch 304 activation threshold, the analog switch 304 may be ON. When the voltage of DELAY is lower than the analog switch 304 activation threshold, the analog switch 304 may be OFF.

When the voltage of the signal N_OVERTEMP is higher than the analog switch 306 activation threshold, the analog switch 306 may be ON. When the voltage of N_OVERTEMP is lower than the analog switch activation threshold, the analog switch 306 may be OFF.

Figure 7:
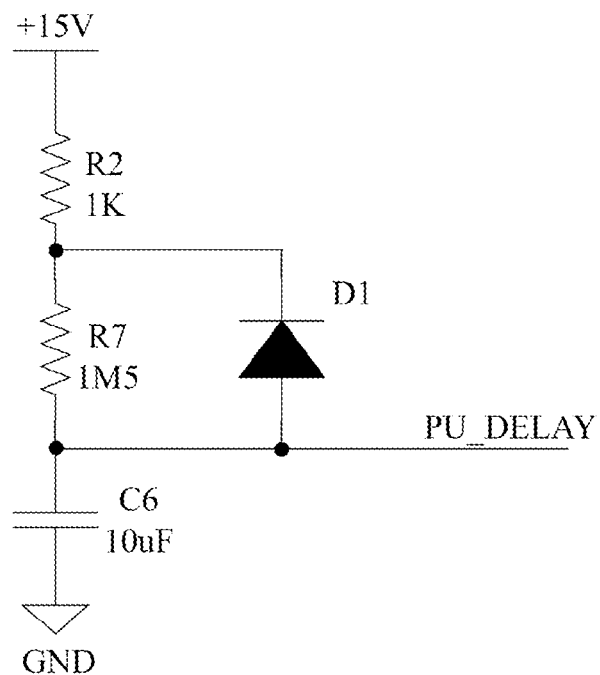
FIG. 7 is a schematic diagram of an example time delay circuit.

The example of FIG. 7 is a schematic diagram of an example time delay circuit 305. At power up, the capacitor C6 may be slowly charged through resistors R2 and R7. After specified seconds, the capacitor voltage PU_DELAY can reach the analog switch 304 activation threshold. If the analog switch activation threshold can be 5V, the period t when the capacitor voltage PU_DELAY can reach 5V can be calculated as follows:

$$v(t)=V(1-e^{-t/\tau})$$

where V=5V, τ=(R2+R7)*C6=(1,000+1,500,000)*10 uF=15, v(t) is the voltage of signal PU_DELAY. t=6 seconds.

It should be recognized that the period t when the capacitor voltage can reach the activation threshold can be as long as the duration of transient state after power up in the Rogowski coil integrator circuit 303.

This circuit can also be re-triggerable through the diode D1 and the resistor R2. If there is a power down, the capacitor C6 can be quickly discharged allowing it to start a new charge cycle. Given the capacitor discharge circuit response time is τ, the capacitor C6 can be fully discharged after 5τ. With τ=R2*C6=1,000*10 uF=10 ms, discharge time=5τ=50 ms.

Figure 8:
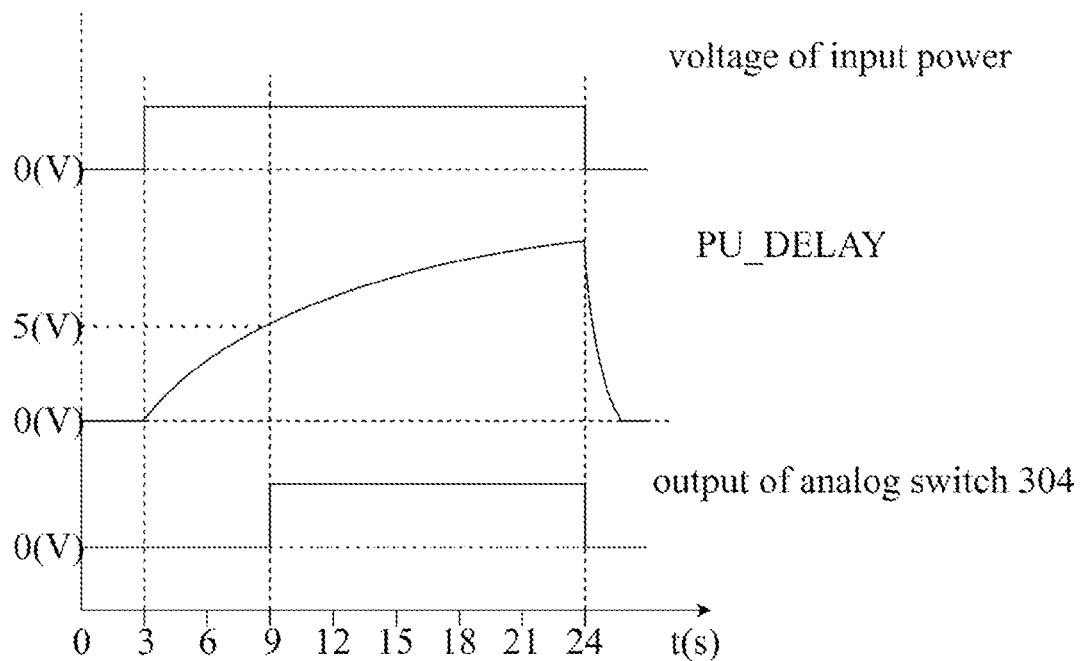
FIG. 8 is a diagram of example waveforms illustrating the relationship between the signal PU_DELAY and output of analog switch when power up and power down.

The example of FIG. 8 is a diagram of example waveforms illustrating the relationship between the signal PU_DELAY and output of analog switch when power up and power down. At 3s, the power supply 201 can supply power to the protective relay Rogowski coil integrator 202. At 9s, the voltage of the signal PU_DELAY increase to 5V, which can be the activation threshold of the analog switch 304. Then the signal PU_DELAY switches on the analog switch 304 and the output of the Rogowski coil integrator circuit 303 can pass the analog switch 304. At 24s, the power supply 201 stop supplying power to the signal conditioning circuit 202. Then the voltage of the signal PU_DELAY can decrease and the output of the Rogowski coil integrator circuit 303 cannot pass the analog switch 304.

Figure 9:
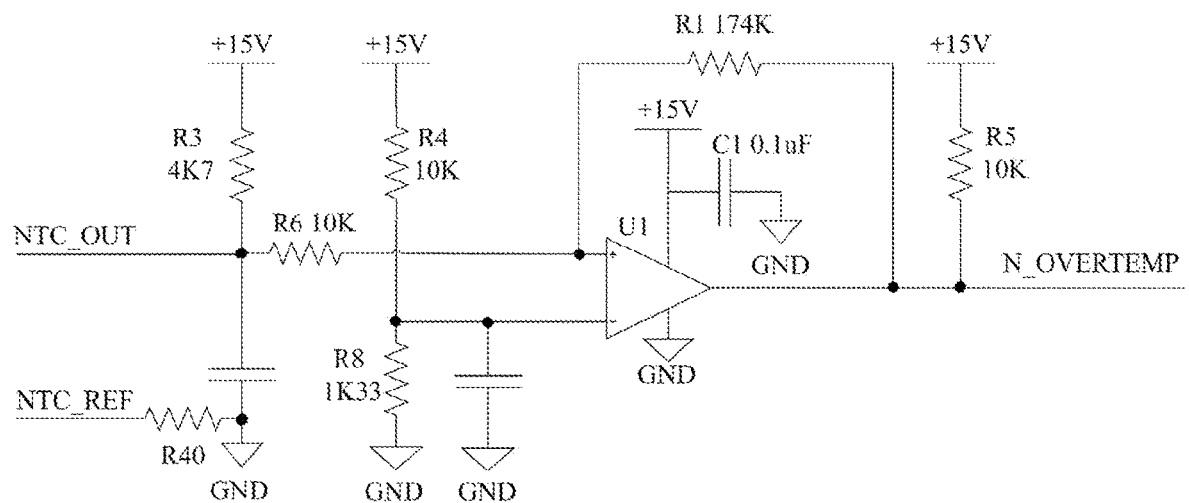
FIG. 9 is a schematic diagram of an example temperature detector circuit.

The example of FIG. 9 is a schematic diagram of an example temperature detector circuit 307. The signal NTC_OUT can be the output of an NTC (Negative Thermal Coefficient) 309, which can be used as a temperature sensor for power stage circuit 308. The signal NTC_REF can be a reference voltage. The NTC 309 can be a material that experiences a decrease in electrical resistance when its temperature is raised. The power stage circuit 308 can perform the basic power conversion from the input voltage to the output voltage. In one embodiment, the power stage circuit can be implemented using a MOSFET (Metal-Oxide Semiconductor Field-Effect Transistor).

The NTC 309 makes a resistive voltage divider with the resistor R3 (4.7K). By using a voltage comparator (U1), a ratiometric comparison can be made with the 1.8V reference voltage. The circuit can integrate a hysteresis through the resistor R1 (174K) to avoid toggling around the detection threshold. It introduces a margin of about 25° C. between the "TRIP TEMP" and the "RESTART TEMP," "TRIP TEMP" can be the temperature when the analog switch 306 can switch off since the power stage circuit 308 can work beyond the maximum withstand temperature. "RESTART TEMP" can be the temperature when the analog switch 306 can switch on again after a period of cooling since the power stage circuit 308 can work in an acceptable temperature.

Figure 10:
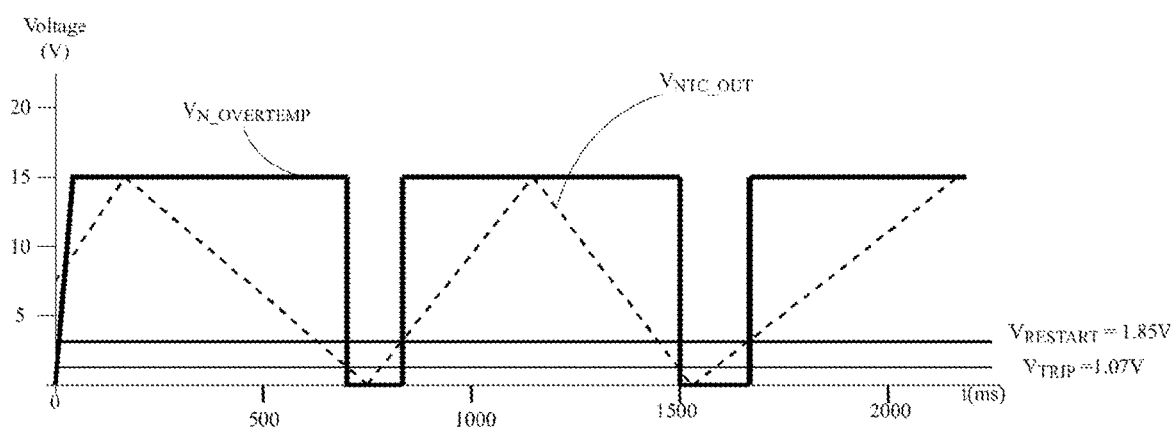
FIG. 10 is a diagram of example waveforms illustrating the relationship between the voltage $V_{N\_OVERTEMP}$ and $V_{NTC\_OUT}$.

The example of FIG. 10 is a diagram of example waveforms illustrating the relationship between the voltage $V_{N\_OVERTEMP}$ and $V_{NTC\_OUT}$. $V_{N\_OVERTEMP}$ may be the voltage of signal N_OVERTEMP and $V_{NTC\_OUT}$ may be the voltage of signal NTC_OUT. $V_{TRIP}$ may be the voltage of signal NTC_OUT when the power stage circuit 308 can work beyond the maximum withstand temperature. At this temperature, the analog switch 306 must be tripped to protect the power stage circuit 308. $V_{RESTART}$ may be the voltage of signal NTC_OUT when the power stage circuit 308 can work in an acceptable temperature after a period of cooling. At this temperature, the analog switch 306 can switch on again to allow the power stage circuit 308 to continue to work.

When the $V_{NTC\_OUT} \leq V_{TRIP}$ (1.07V), $V_{N\_OVERTEMP}$ becomes low thus turning the analog switch 306 ON. In the same way, when the $N_{NTC\_OUT} \geq V_{RESTART}$ (1.85V), $V_{N\_OVERTEMP}$ becomes high thus turning the analog switch 306 OFF.

Embodiments of the teachings of the present disclosure have been described in an illustrative manner. It is to be understood that the terminology, which has been used, is intended to be in the nature of words of description rather than of limitation. Many modifications and variations of the embodiments are possible in light of the above teachings. Therefore, within the scope of the appended claims, the embodiments can be practiced other than specifically described.

What is claimed is:

1. A signal conditioning circuit for monitoring at least one parameter of an electrical signal in an electrical conductor, comprising:
   an integrator circuit having an input for receiving a signal from a current sensor coupled to the electrical conductor;
   a first analog switch having an input coupled to the output of the integrator circuit, wherein the first analog switch is controlled by the output of a time delay circuit; and
   a power stage circuit having an input coupled to the output of the first analog switch.

2. The signal conditioning circuit of claim 1, wherein the time delay circuit triggers the first analog switch to isolate the power stage circuit from the integrator circuit when the integrator circuit works in a transient state at power up.

3. The signal conditioning circuit of claim 1, wherein the time delay circuit triggers the first analog switch to conduct electricity from the integrator circuit to the power stage circuit when the integrator circuit works in a steady state after power up.

4. The signal conditioning circuit of claim 1, wherein the power stage circuit has an output coupled to a protective relay device.

5. The signal conditioning circuit of claim 1, further comprising a scaling circuit having an output coupled to the integrator circuit to configure a current range of the electrical conductor.

6. The signal conditioning circuit of claim 1, further comprising a second analog switch having an input coupled to the output of the first analog switch, wherein the second analog switch is controlled by a temperature detector circuit to detect a working temperature of the power stage circuit.

7. The signal conditioning circuit of claim 6, wherein the temperature detector circuit triggers the second analog switch to isolate the power stage circuit from the integrator circuit when the power stage circuit works above a first specified temperature.

8. The signal conditioning circuit of claim 6, wherein the temperature detector circuit triggers the second analog switch to conduct electricity from the integrator circuit to the power stage circuit when the power stage circuit works below a second specified temperature.

9. The signal conditioning circuit of claim 1, further comprising a signal filtering circuit having an output coupled to the integrator circuit.

10. The signal conditioning circuit of claim 1, wherein the current sensor comprises a Rogowski coil.

11. A protective relay system, comprising:
    a current sensor located proximate a current conductor for detecting current in the conductor; and
    a signal conditioning circuit coupled to the current sensor, comprising:
       an integrator circuit;
       a time-controlled switch having an input coupled to the output of the integrator circuit;
       a power stage circuit having an input coupled to the output of the time-controlled switch;
    a protective relay device coupled to the signal conditioning circuit; and
    a circuit breaker coupled to the protective relay device.

12. The protective relay system of claim 11, wherein the current sensor comprises a Rogowski coil.

13. The protective relay system of claim 11, wherein the time-controlled switch comprises an analog switch controlled by a time delay circuit.

14. The protective relay system of claim 11, further comprising a power supply powering the signal conditioning circuit.

15. The protective relay system of claim 11, wherein the time-controlled switch isolates the power stage circuit from the integrator circuit when the integrator circuit works in a transient state at power up.

16. The protective relay system of claim 11, wherein the time-controlled conducts electricity from the integrator circuit to the power stage circuit when the integrator circuit works in a steady state after power up.

17. The protective relay system of claim 11, wherein the power stage circuit has an output coupled to a protective relay device.

18. The protective relay system of claim 11, further comprising a temperature-controlled switch connected with the time-controlled switch in series.

19. The protective relay system of claim 18, wherein the temperature-controlled switch isolates the power stage circuit from the integrator circuit when the power stage circuit works above a third specified temperature.

20. The protective relay system of claim 18, wherein the temperature-controlled switch conducts electricity from the integrator circuit to the power stage circuit when the power stage circuit works below a fourth specified temperature.

\* \* \* \* \*